United States Patent
Muller et al.

(10) Patent No.: US 8,656,725 B2
(45) Date of Patent: Feb. 25, 2014

(54) THERMAL GENERATOR WITH MAGNETOCALORIC MATERIAL

(75) Inventors: Christian Muller, Strasbourg (FR); Jean-Claude Heitzler, Horbourg-Wihr (FR)

(73) Assignee: Cooltech Applications Société par actions simplifiée, Holtzheim (FR)

( * ) Notice: Subject to any disclaimer, the term of this patent is extended or adjusted under 35 U.S.C. 154(b) by 349 days.

(21) Appl. No.: 13/120,691

(22) PCT Filed: Sep. 23, 2009

(86) PCT No.: PCT/FR2009/001129
§ 371 (c)(1),
(2), (4) Date: Mar. 24, 2011

(87) PCT Pub. No.: WO2010/061064
PCT Pub. Date: Jun. 3, 2010

(65) Prior Publication Data
US 2011/0215088 A1   Sep. 8, 2011

(30) Foreign Application Priority Data
Sep. 25, 2008  (FR) ...................................... 08 05278

(51) Int. Cl.
*F25B 21/00* (2006.01)
(52) U.S. Cl.
USPC .................................... 62/3.1; 62/3.6; 62/383
(58) Field of Classification Search
USPC .............. 62/3.1, 3.3, 3.6, 383, 467; 417/44.1, 417/218
See application file for complete search history.

(56) References Cited

U.S. PATENT DOCUMENTS

| | | | | | |
|---|---|---|---|---|---|
| 4,916,907 A | * | 4/1990 | Munk et al. | ...................... | 62/3.1 |
| 5,357,756 A | * | 10/1994 | Lubell | .............. | 62/3.1 |
| 5,927,950 A | * | 7/1999 | Juvenal | ........................... | 417/38 |
| 6,526,759 B2 | * | 3/2003 | Zimm et al. | ...................... | 62/3.1 |
| 6,588,215 B1 | * | 7/2003 | Ghoshal | ........................... | 62/3.1 |
| 6,588,216 B1 | * | 7/2003 | Ghoshal | ........................... | 62/3.1 |
| 6,595,004 B1 | * | 7/2003 | Ghoshal | ........................... | 62/3.1 |
| 6,668,560 B2 | * | 12/2003 | Zimm et al. | ...................... | 62/3.1 |
| 6,739,137 B2 | * | 5/2004 | Minovitch | ...................... | 62/3.1 |
| 6,935,121 B2 | * | 8/2005 | Fang et al. | ........................ | 62/3.1 |
| 7,536,866 B2 | * | 5/2009 | Kobayashi et al. | .............. | 62/3.1 |
| 7,596,955 B2 | | 10/2009 | Muller et al. | | |
| 7,650,756 B2 | * | 1/2010 | Muller et al. | ................... | 62/3.1 |
| 2010/0236258 A1 | | 9/2010 | Heitzler et al. | | |

FOREIGN PATENT DOCUMENTS

| | | |
|---|---|---|
| FR | 2 861 454 A1 | 4/2005 |
| FR | 07/07612 | 5/2009 |
| WO | 03/016794 A1 | 2/2003 |
| WO | 2009/087310 A2 | 7/2009 |

* cited by examiner

*Primary Examiner* — Mohammad M Ali
(74) *Attorney, Agent, or Firm* — Davis & Bujold, PLLC; Michael J. Bujold

(57) ABSTRACT

A thermal generator (1) comprises at least one thermal flow generation unit (2) that is provided with at least one thermal module (3) each containing a magnetocaloric member (4) through which a coolant flows. A magnetic arrangement (9) is actuated for alternatively subjecting each magnetocaloric member (4) to a variation in magnetic field, the alternating movement of the coolant is synchronized with the magnetic field variation, the magnetocaloric member (4) is integrated into a closed flow circuit (6) that connects the two opposite ends (7) of the magnetocaloric member (4), and the closed circuit includes a single element (5) for moving the coolant through the magnetocaloric member (4).

14 Claims, 7 Drawing Sheets

THERMAL GENERATOR WITH MAGNETOCALORIC MATERIAL

This application is a National Stage completion of PCT/FR2009/001129 filed Sep. 23, 2009, which claims priority from French patent application serial no. 08/05278 filed Sep. 25, 2008.

FIELD OF THE INVENTION

The present invention relates to a heat generator with magnetocaloric material comprising at least one thermal flux generation unit provided with at least one thermal module containing a magnetocaloric element across which a heat transfer fluid circulates according to an alternating movement on both sides of the magnetocaloric element, the heat generator comprising also a magnetic arrangement put in motion to alternately subject the magnetocaloric element to a magnetic field variation and create alternately in the magnetocaloric element a heating cycle and a cooling cycle, generating the creation of, and then maintaining, a temperature gradient between the two opposite ends of the magnetocaloric element, the alternating displacement of the heat transfer fluid being synchronized with the magnetic field variation, the magnetocaloric element being integrated in a closed heat transfer fluid circulation circuit connecting the two opposite ends of the magnetocaloric element and the closed circuit comprising a single means of displacement of the heat transfer fluid through the magnetocaloric element in both displacement directions.

BACKGROUND OF THE INVENTION

Magnetic refrigeration technology at ambient temperature has been known for more than twenty years and the advantages it provides in terms of ecology and sustainable development are widely acknowledged. Its limits in terms of its useful calorific output and its efficiency are also well known. Consequently, all the research undertaken in this field tends to improve the performance of such a generator, by adjusting various parameters, such as the magnetization power, the performance of the magnetocaloric element, the surface for heat exchange between the heat transfer fluid and the magnetocaloric elements, the performance of the heat exchangers, etc.

One of the difficulties in the realization of generators that use one or more magnetocaloric elements lies in the exchange of thermal energy between these magnetocaloric elements and the circuit(s) that use, consume or exchange the thermal energy with the generator, and that are connected with the latter. A solution for performing this exchange consists in making a heat transfer fluid, liquid or not, circulate through the magnetocaloric elements, in synchronization with the variation of the magnetic field which the magnetocaloric elements are subjected to and to perform then a thermal exchange between the heat transfer fluid and the circuits.

The publication WO 03/016794 gives an example of implementation in which the magnetocaloric elements are in a closed fluid circuit including a circulation pump for the heat transfer fluid, located outside of the thermal module and requiring specific control and connection means.

In the French patent application no. 07/07612, the applicant presents a heat generator with magnetocaloric material in which the heat transfer fluid is circulated between the magnetocaloric elements and two exchange chambers called a hot chamber and a cold chamber. This circulation is carried out by means of two sets of pistons that are positioned opposite the magnetocaloric elements and driven by a control cam connected to an actuator.

This generator nevertheless has a disadvantage related to the need for two cams to drive the two sets of pistons positioned opposite each magnetocaloric element. This leads to an increase of the number of parts making up the generator, and more specifically of the number of moving parts and thus to an increase of the risk of malfunction, to a higher risk of wear due to the permanent contact between the cam and the pistons, and to a degradation of the efficiency of the generator. Furthermore, the high number of parts also increases the space requirement of the generator and thus limits its ability to be integrated in environments in which the available space is reduced and limited.

SUMMARY OF THE INVENTION

The present invention aims to overcome these disadvantages by offering a heat generator in which the number of moving elements is reduced and whose configuration allows an important reduction of the space requirement of the generator.

For this purpose, the invention concerns a heat generator comprising a thermal flux generation unit comprises a field closing device arranged to loop the magnetic flux generated by the magnetic arrangement and in that the field closing device is provided with a control device of the means of displacement.

The closed circuit can be made of one or several conduits or channels connecting the opposite ends of the magnetocaloric element.

The integration of a single means of displacement allows limiting the number of parts of the heat generator and thus reducing its production cost. Likewise, the use of a device necessary for the operation of the generator as a device allowing to actuate the means of displacement of the heat transfer fluid allows for an even further reduction of the number of parts making up the generator and, furthermore, to reduce its space requirement.

The means of displacement can be a piston that moves in a jacket formed in the corresponding closed circuit.

Advantageously, the field closing device can be made out of a magnetizable material and be coupled magnetically with the mobile magnetic arrangement.

In a first embodiment variant, the control device can be a cam profile with an approximately sinusoidal shape whose amplitude determines the stroke of the pistons and whose sinusoidal phase corresponds globally to a heating cycle and to a cooling cycle of the magnetocaloric elements.

For that purpose, the piston can comprise a groove in which the cam profile circulates.

In a second embodiment variant, the piston can include a zone of magnetizable material and can be coupled magnetically with the field closing device making up the control device.

In a first embodiment, the thermal flux generation unit can be provided with several thermal modules and have a circular structure in which the magnetocaloric elements are arranged on a circle around a central axis, the magnetic arrangement can be rotated around the central axis and the magnetocaloric elements can be arranged between the magnetic arrangement and the field closing device.

In this configuration, the field closing device can be coupled magnetically with the magnetic arrangement and the closed circuit and the jacket of the piston can be made of two circular parts meant for being assembled, the circular parts can be approximately symmetrical with respect to their assembly plane, and can each comprise at least one recess forming a part of the jacket of a piston and a groove with open ends and forming a connection channel between the recess and the corresponding magnetocaloric element.

According to a second embodiment, the thermal flux generation unit can have a linear structure in which the magnetocaloric elements are aligned and the magnetic arrangement can be driven in reciprocating translation along the magnetocaloric elements.

In this embodiment, the field closing device can have a yoke-shaped profile whose both legs are provided, on their internal faces, with permanent magnets with opposite polarities and making up the magnetic arrangement and the control device can have the shape of a driving pin housed in a corresponding groove of each piston.

As a variant, the field closing device can also have a yoke-shaped profile whose both legs are provided, on their internal faces, with permanent magnets with opposite polarities and making up the magnetic arrangement, the control device can nonetheless comprise two permanent magnets with different polarities located at a distance and opposite from each other and the piston can comprise a magnet arranged with respect to the permanent magnets of the control device so as to be pushed back by each of the latter, and thus follow their displacement. The movement of the control device thus leads to that of the piston, without contact between them, apart from the magnetic arrangement. For that purpose, the piston can be located approximately between the two permanent magnets of the control device and preferably above them.

In order to ensure that the heat exchange between the magnetocaloric element and the heat transfer fluid occurs after a phase change of the magnetocaloric element, the generator can also comprise, in its linear version, an offset means suitable for anticipating and/or delaying the movement of the piston with respect to that of the magnetic arrangement.

BRIEF DESCRIPTION OF THE DRAWINGS

The present invention and its advantages will be better revealed in the following description of an embodiment given as a non limiting example, in reference to the drawings, in which.

DETAILED DESCRIPTION OF THE PREFERRED EMBODIMENTS

In the implementation examples shown, identical parts or sections have the same numerical references.

FIGS. 1 to 6 represent a heat generator 1 according to a first embodiment of the invention, in which the structure of the generator 1 is circular.

Figure 1:
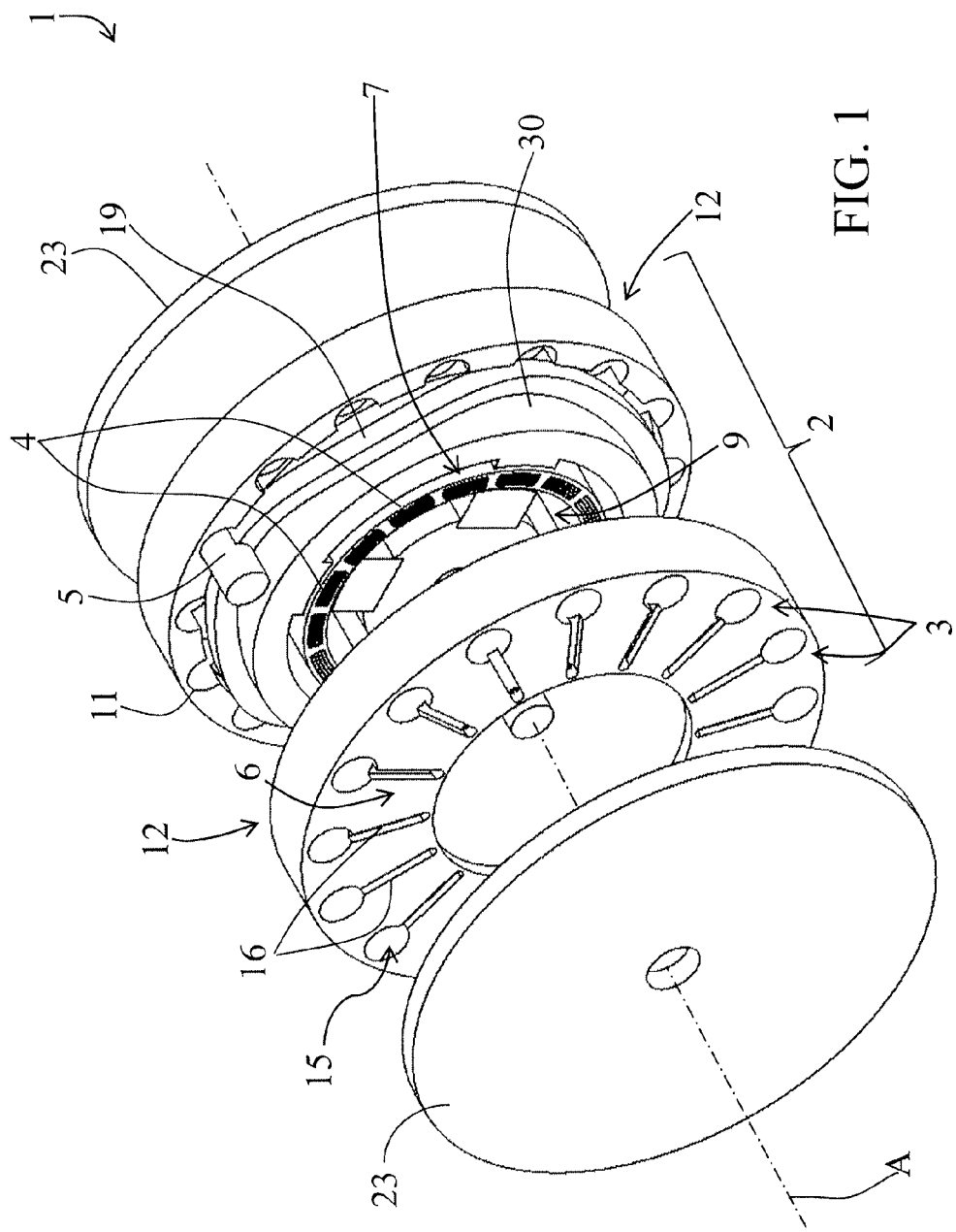
FIG. 1 is an exploded view of a heat generator with a circular configuration, according to a first embodiment of the invention.
Figure 2:
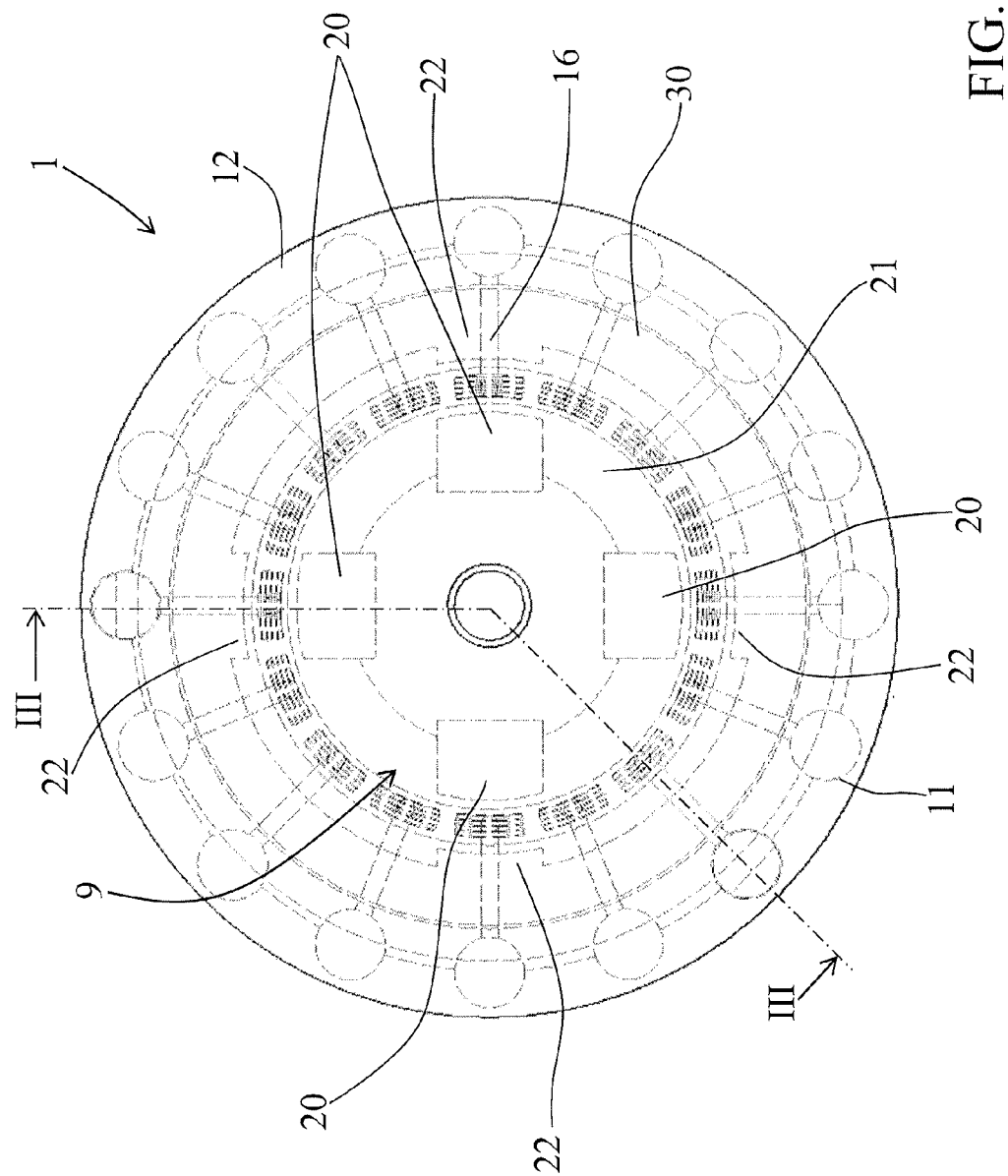
FIG. 2 is a transparent front view of the thermal module of the generator of FIG. 1.
Figure 4:
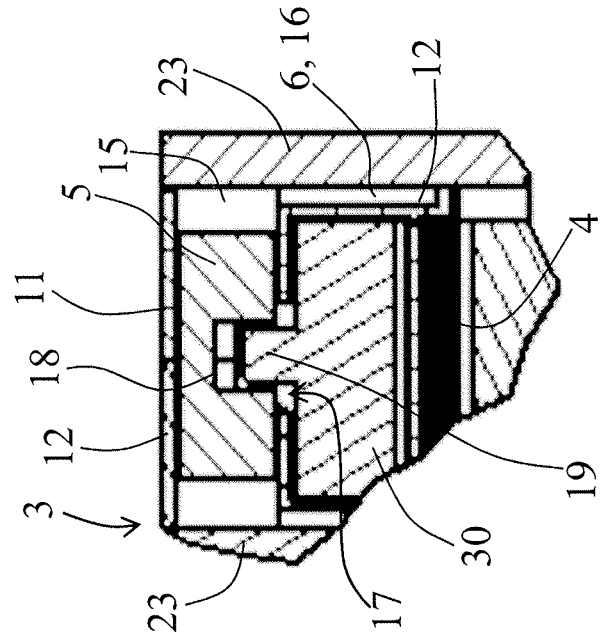
FIG. 4 is a view of detail B of FIG. 3.
Figure 3:
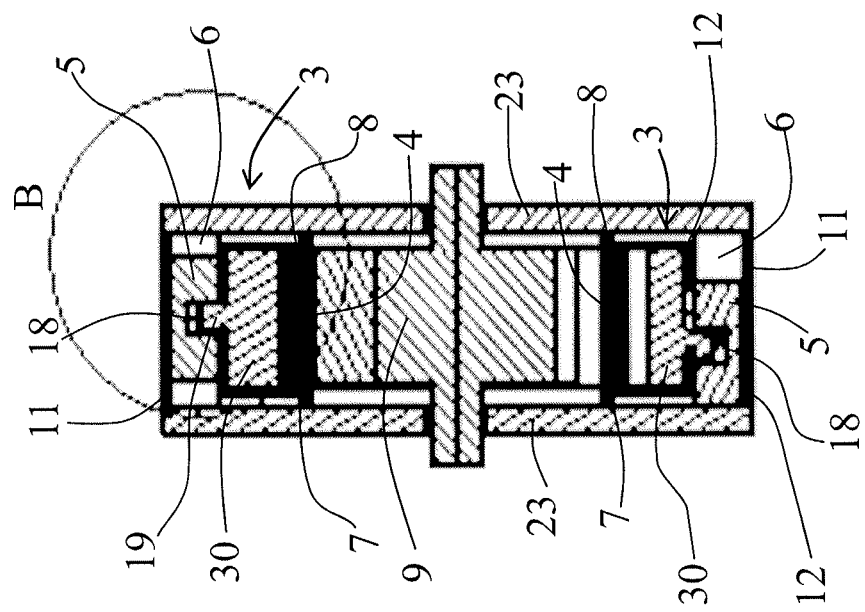
FIG. 3 is a section view along plane III-Ill of FIG. 2.

The heat generator 1 represented in FIGS. 1 to 4 comprises only one thermal flux generating unit 2. This unit is provided with several thermal modules 3 each comprising a magnetocaloric element 4 across which a heat transfer fluid is circulated by a means of displacement 5 in the form of a piston. For simplification reasons, only one piston 5 is represented in FIG. 1. The magnetocaloric elements 4 are arranged in a circle around a central axis A and a magnetic arrangement 9 rotates around the central axis A so as to submit the magnetocaloric elements 4 to a variable magnetic field to perform alternately a heating cycle and a cooling cycle in the latter.

The magnetocaloric elements 4 are permeable to the heat transfer fluid and can be made of one or several magnetocaloric materials. They comprise open fluid passages that can be made of the pores of a porous material, the mini or microchannels machined in a full block or obtained by assembling for example superposed grooved plates.

The heat transfer fluid is moved in each thermal module 3 in a reciprocating movement through the magnetocaloric element 4, on either side of the latter. For that purpose, the thermal module 3 also comprises a closed circuit 6 for the circulation of the heat transfer fluid. This circuit is made of channels connecting the two opposite ends 7 and 8 of the magnetocaloric element 4 and comprises a means of displacement 5 that moves the heat transfer fluid in a reciprocating movement. In the represented examples, the means of displacement 5, 50, 60 is a piston. It can nevertheless be realized in any other form, such as a membrane for example, suitable for generating reciprocating movement of the heat transfer fluid.

All the described embodiments show that by fluidly connecting both ends 7 and 8 of the magnetocaloric element 4 only one means of displacement 5, 50, 60 is needed to circulate the heat transfer fluid in both directions through the magnetocaloric element 4. This makes the construction of the heat generator according to the invention easier and also limits its space requirement since, on the one hand, only one means of displacement 5, 50, 60 is required for the circulation of the heat transfer fluid in each thermal module and, on the other hand, this implies the installation of only one control device of the means of displacement.

The heat generator 1 also comprises a magnetic arrangement 9 put in motion to subject alternately each magnetocaloric element 4 to a magnetic field variation and create alternately in the magnetocaloric element 4 a heating cycle and a cooling cycle, generating the creation of, and then maintaining, a temperature gradient between the two opposite ends 7 and 8 of the magnetocaloric element 4 and the reciprocating movement of the heat transfer fluid is synchronised with the variation of the magnetic field.

The piston 5 is moved in a jacket 11 by means of a cam profile 19 forming a control device, provided on the side of a field closing device 30 arranged to loop the magnetic flux generated by the magnetic arrangement 9. This field closing device 30 is located opposite the jacket 11 of the piston 5. For minimizing the space requirement, all pistons 5, the magnetocaloric elements 4, the magnetic arrangement 9 and the field closing device 30 are arranged concentrically around the central axis A. The jacket 11 comprises an opening 17 to facilitate positioning the cam profile 19 in a corresponding groove 18 of the piston 5 in order to actuate the latter. For that purpose, the cam profile 19 has an approximately sinusoidal shape, with an amplitude that determines the stroke of the pistons 5 and a sinusoidal phase that corresponds globally to a heating cycle and a cooling cycle of the magnetocaloric elements 4. Rotation of the field closing device 30, and thus of the cam profile 19, leads to the displacement of the pistons 5, according to a reciprocating movement. This rotation is generated through the intermediary of the rotation of the magnetic arrangement 9, with which the field closing device 30 is coupled magnetically.

For that purpose, the magnetic arrangement 9 is made of an assembly of magnetized parts 20 and non magnetized parts 21 and the field closing device 30 is made in the shape of a ring out of a magnetizable material, for example iron, comprising bosses or protuberances 22 located opposite the magnetized parts 20 to allow magnetic coupling with the magnetic arrangement 9 and obtain this way the rotational drive of the field closing device 30 when the magnetic arrangement 9 rotates. Even though the field closing device 30 represented comprises four bosses 22, only one boss is sufficient to obtain the magnetic coupling.

The magnetic arrangement 9 can be coupled with an actuator (not represented) in order to be mobile in rotation with respect to the magnetocaloric elements 4. The simultaneous movement of the magnetic arrangement 9 and of the field closing device 30 in particular avoids the generation of eddy currents. The magnetocaloric elements 4 are arranged around the magnetic arrangement 9 and between the latter and the field closing device 30. This way, displacement of the magnetic arrangement 9 subjects the magnetocaloric elements 4 to a magnetic field variation and simultaneously leads to displacement of the field closing device 30.

The heat generator 1 represented in FIGS. 1 to 4 has a configuration that favours a limited space requirement, in particular thanks to the concentric structure around the central axis A and formed by the magnetic arrangement 9, the field closing device 30 in form of a ring, the magnetocaloric elements 4 also arranged concentrically around the central axis A and finally the pistons 5 integrated in the jackets 11 provided in two circular parts 12 and also concentric with the above-mentioned elements. Such a heat generator 1 can thus have a width of a few centimeters.

The two circular parts 12 are symmetrical with respect to their assembly plane and comprise recesses 15 which form a part of the jacket 11 of the pistons 5 and a groove 16 fluidly connecting each recess 15 with the corresponding magnetocaloric element 4. The circular parts 12 are arranged so that the cam profile 19 is positioned in the groove 18 of each piston 5. The recesses 15 and the grooves 16 of the circular parts 12 can be produced by boring, drilling, moulding or any other similar process and form a part of the closed circuit 6 for the circulation of the heat transfer fluid.

The generator 1 also comprises two protective covers 23 that tightly close the grooves 16 of the circular parts 12.

Figure 5:
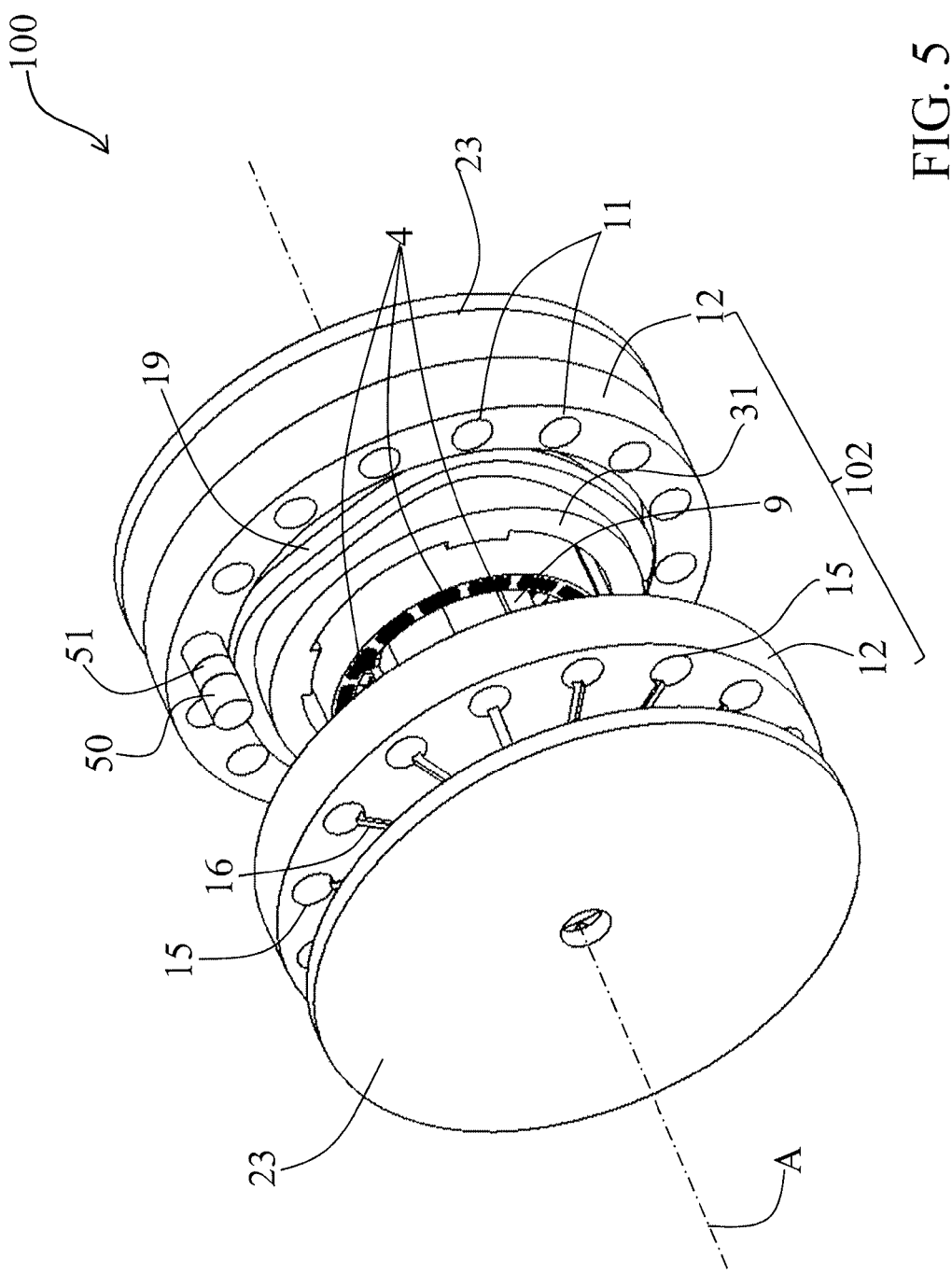
FIG. 5 is an exploded view of an embodiment variant of a circular heat generator.
Figure 6:
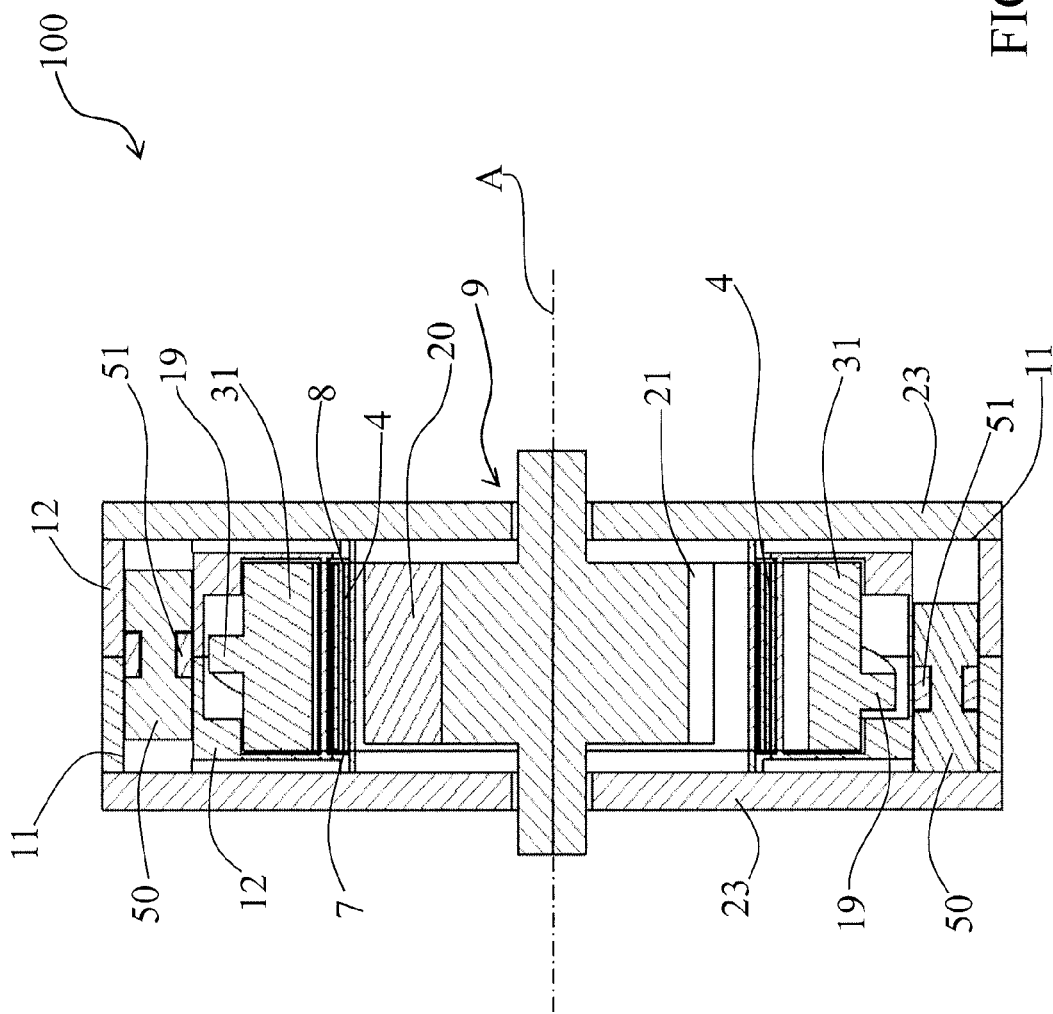
FIG. 6 is a longitudinal sectional view of the generator represented in FIG. 5, FIGS. 7A and 7B are perspective views of a heat generator with a linear configuration, according to a second embodiment of the invention, in two positions of the magnetic arrangement.

The heat generator 100 represented in FIGS. 5 and 6 is made according to a variant of the embodiment in which the structure of the generator 100 is circular and comprises a circular thermal flux generation unit 102. The configuration of this generator is approximately identical with that of the generator 1 represented in FIGS. 1 to 4 and offers the same advantages, in particular regarding the reduced space requirement. However, the piston 50 is driven differently. As previously, the control device of the pistons 50 is made up of the field closing device 31. But the pistons 50 are provided with a ring 51 made of a magnetisable material that couples magnetically with the field closing device 31 and follows the rotation of the latter without contact. The field closing device 31 can also comprise a cam profile 19 like that of the heat generator 1 of FIGS. 1 to 4. However, in this example, it is not necessary to provide a groove in each piston 50, since the field closing device 31 drives each piston 50 without any contact, by magnetic coupling. There is thus no risk of wear between the control device and the pistons 50. The pistons 50 are preferably approximately cylindrical and have an area of magnetizable material 51 in the form of a ring mounted in a circular groove of the piston 50.

Any other piston form can also suit and can be determined to minimize the hydraulic head losses.

Figures 7A, 7B:
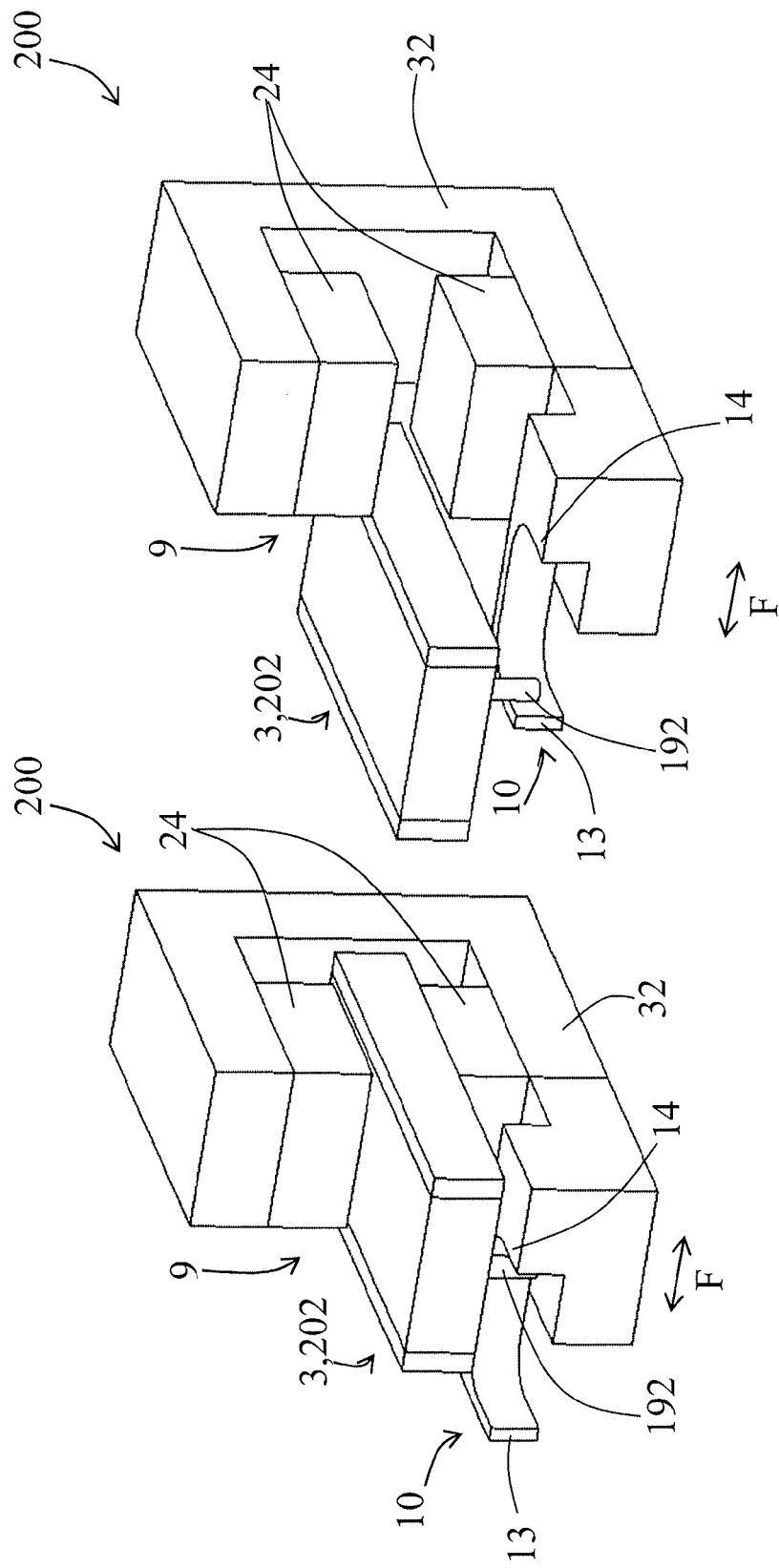
Figure 8:
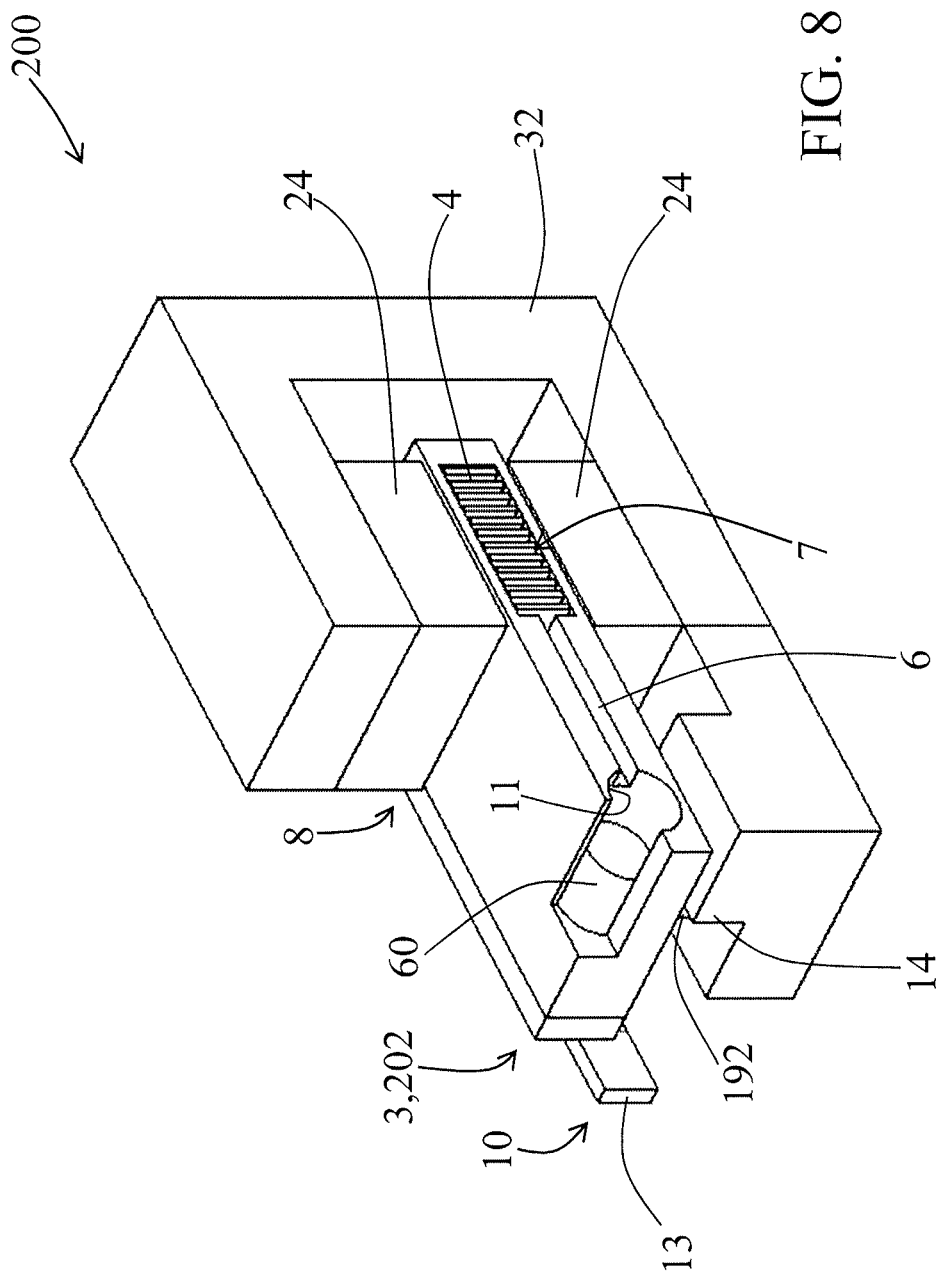
FIG. 8 is a partial section view of FIG. 7A.

FIGS. 7A, 7B and 8 represent a heat generator 200 according to a second embodiment of the invention, in which the structure of the generator 200 is approximately linear. FIG. 8 represents more specifically, at the level of the cut section, the closed heat transfer fluid circulation circuit 6, the magnetocaloric element 4 and the piston 60.

The thermal flux generation unit 202 is linear, the magnetocaloric elements 4 being aligned. In the represented example, the heat generator 200 is made up of only one unit 202 comprising a thermal module 3. The invention covers, of course, heat generators comprising several thermal flux generation units. The number of units and thermal modules will be determined as a function of the power of the heat generator.

The field closing device 32 has a yoke-shaped profile whose both legs are provided, on their internal faces, with permanent magnets 24 with opposite polarities and making up the magnetic arrangement 9. The reciprocating translational movement (according to arrow F) of the field closing device 32 and of the magnetic arrangement 9 subjects the magnetocaloric elements 4 aligned between the magnets 24 to a magnetic field variation. Furthermore, the field closing device 32 comprises, for each piston 60, a driving pin 192 to drive it. The driving pin ensures the mechanical coupling between the field closing device 32 and the heat transfer fluid displacement means, here in the form of pistons 60. This way, the movement of the magnetic arrangement 32 leads on the one hand to a variation of the magnetic field in the magnetocaloric elements 4, and thus to an alternation of heating and cooling cycles of the latter and, on the other hand, to the simultaneous movement of the driving pins 192 which in turn move the pistons 60 in the corresponding jacket 11, and thus the heat transfer fluid in the closed circuit 6.

Furthermore, the represented generator 200 comprises an offset means 10 that allows offsetting the movement of the piston 60 with respect to that of the magnetic arrangement 32. This means is implemented in the form of two stops 13, 14 made in a U-shaped part that is mounted on the field closing device 32. These two stops 13, 14 are arranged underneath the piston 60 and co-operate with the driving pin 192. The latter is thus driven by these two stops 13, 14 when the field closing device 32 moves according to arrow F. They allow controlling the movement of the piston 60 in synchronism with the movement of the field closing device 32.

So, in FIG. 7A, when the field closing device 32 moves towards the right, it only drives the driving pin 192, and thus the piston 60 associated to the latter, when the stop 14 comes in contact with the driving pin 192, position represented in FIG. 7B. During this movement, the magnetocaloric element 4 has left the magnetic field of the magnets 24 and was subjected to a cooling cycle without movement of the piston 60. The heat exchange between the hear transfer fluid and the magnetocaloric element 4 thus takes place when the stop 14 arrives in contact with the driving pin 192 and the field closing device 32 moves further towards the right in the figure, thus moving the piston 60 in the closed circuit 6. The complete stroke of the field closing device 32 is not transmitted totally to the piston 60.

Conversely, during the movement of the field closing device 32 towards the left on FIG. 7B, the magnetocaloric element 4 is subjected to a magnetic field and thus to a heating cycle, without any move of the piston 60, and thus of the heat transfer fluid. When the driving pin 192 comes in contact with the stop 13, the latter drives it, which induces a movement of the corresponding piston 60, and thus movement of the heat transfer fluid in the closed circuit 6 and thus heat exchange between the latter and the magnetocaloric element 4.

Such an offset means enables optimizing the heat exchange between the heat transfer fluid and the magnetocaloric element 4 by performing it after a phase change of the magnetocaloric element 4, and thus increasing the efficiency of the generator 200.

In a non represented variant, the field closing device can have a yoke-shaped profile whose both legs are provided, on their internal faces, with permanent magnets with opposite polarities and making up the magnetic arrangement, the control device can nonetheless comprise two permanent magnets with different polarities located at a distance and opposite of each other and the piston can comprise a magnet arranged with respect to the permanent magnets of the control device so as to be pushed back by each of the latter, and thus follow their displacement. The displacement of the control device thus leads to that of the piston, without contact between the latter, apart from the magnetic arrangement. For that purpose, the piston can be located approximately between the two permanent magnets of the control device and preferably above them.

Even though all attached drawings illustrate heat generators 1, 100, 200 comprising only one thermal flux generation unit 2, the invention also provides for the production of a heat generator having a stepped structure with several thermal flux generation units 2, 102, 202. Such a configuration allows increasing the efficiency of the heat generator according to the invention.

Possibilities for Industrial Application:

This description shows clearly that the invention allows reaching the goals defined, that is to say to offer a heat generator 1, 100, 200 with a simple design and with a reduced space requirement, limiting the number of moving elements for the circulation of the heat transfer fluid in the thermal modules 3.

Such a heat generator 1, 100, 200 can find an application, in industry as well as domestic, in the area of heating, air conditioning, tempering, cooling or others, at competitive costs and with reduced space requirements.

Furthermore, all parts making up this heat generator 1, 100, 200 can be manufactured according to reproducible industrial processes.

The present invention is not restricted to the example of embodiment described, but extends to any modification or variant which is obvious to a person skilled in the art while remaining within the scope of the protection defined in the attached claims.

The invention claimed is:

1. A heat generator with a magnetocaloric material, the heat generator comprising:
   at least one thermal flux generation unit (2, 102, 202) provided with at least one thermal module (3) containing a magnetocaloric element (4), crossed by a heat transfer fluid circulated according to an alternating movement on both sides of the magnetocaloric element (4);
   a magnetic arrangement (9, 24) being movable to subject alternately the magnetocaloric element (4) to a magnetic field variation and alternately create, in the magnetocaloric element (4), a heating cycle and a cooling cycle, generating creation of and then maintaining a temperature gradient between two opposite ends (7, 8) of the magnetocaloric element (4), alternating displacement of the heat transfer fluid being synchronized with the magnetic field variation;
   the thermal flux generation unit (2, 102, 202) comprising a field closing device (30, 31, 32) arranged to loop magnetic flux generated by the magnetic arrangement (9, 24);
   the magnetocaloric element (4) being integrated in a closed heat transfer fluid circulation circuit (6) which interconnects the two opposite ends (7, 8) of the magnetocaloric element (4), and
   the closed heat transfer fluid circulation circuit (6) comprising a single means of displacement (5, 50, 60) of the heat transfer fluid through the magnetocaloric element (4) in both displacement directions;
   wherein the field closing device (30, 31, 32) is movable and comprises a control device (19, 192) for driving the means of displacement (5, 50, 60) of the heat transfer fluid.

2. The heat generator according to claim 1, wherein the closed heat transfer fluid circulation circuit (6) comprises at least one of either a conduit and a channel connected with the two opposite ends (7, 8) of the magnetocaloric element (4).

3. The heat generator according to claim 1, wherein the means of displacement is a piston (5, 50, 60) moves in a jacket (11) formed in the corresponding closed heat transfer fluid circulation circuit (6).

4. The heat generator according to claim 3, wherein the field closing device (30, 31) is made out of a magnetizable material and is magnetically coupled with the mobile magnetic arrangement (9).

5. The heat generator according to claim 4, wherein the control device is a cam profile (19) with an approximately sinusoidal shape and an amplitude that determines a stroke of the pistons (5), and a sinusoidal phase of the cam profile corresponds globally to a heating cycle and a cooling cycle of the magnetocaloric element (4).

6. The heat generator according to claim 5, wherein the piston (5) comprises a groove (18) in which the cam profile (19) circulates.

7. The heat generator according to claim 4, wherein the piston (50) comprises an area made from a magnetizable material (51) and the piston (50) is magnetically coupled with the field closing device (31) which forms the control device.

8. The heat generator according to claim 1, wherein the thermal flux generation unit (2, 102) is provided with several thermal modules (3) and has a circular structure in which the magnetocaloric elements (4) are arranged in a circle around a central axis (A), the magnetic arrangement (9) is rotated around the central axis (A) and the magnetocaloric elements (4) are arranged between the magnetic arrangement (9) and the field closing device (30, 31), the field closing device (30, 31) is coupled magnetically with the magnetic arrangement (9), the closed heat transfer fluid circulation circuit (6) and a jacket (11) of the piston are two circular parts (12) that are assembled, and are approximately symmetrical with respect to their assembly plane, and each of the two circular parts comprise at least one recess (15) forming a part of the jacket of a piston (5) and a groove (16) with open ends and forming a connection channel between a recess (15) and the corresponding magnetocaloric element (4).

9. The heat generator according to claim 1, wherein the thermal flux generation unit (202) has a linear structure in which the magnetocaloric elements (4) are aligned and the magnetic arrangement (9) is driven in reciprocating translation along the magnetocaloric elements (4), the field closing device (32) has a yoke-shaped profile with legs which are provided, on internal faces with permanent magnets (24) with opposite polarities and make up the magnetic arrangement (9), and the control device (192) has a shape of a driving pin housed in a corresponding groove (25) of each means of displacement, and the means of displacement is a piston (60).

10. The heat generator according to claim 9, wherein the heat generator comprises an offset means (10) suitable for at least one of anticipating and delaying the movement of the piston (60) with respect to that of the magnetic arrangement (9).

11. The heat generator according to claim 1, wherein the field closing device (30, 31, 32) and the magnetic arrangement (9, 24) move in synchronization with one another during at least a portion of the heating cycle or the cooling cycle.

12. The heat generator according to claim 1, wherein the field closing device (30, 31, 32) and the magnetic arrangement (9, 24) both move with respect to the magnetocaloric elements (4).

13. A heat generator with magnetocaloric material comprising:
- at least one thermal flux generation unit (2, 102, 202) provided with at least one thermal module (3) containing a magnetocaloric element (4), crossed by a heat transfer fluid circulated according to an alternating movement on both sides of the magnetocaloric element (4);
- a magnetic arrangement (9, 24) being movable for alternately subjecting the magnetocaloric element (4) to a magnetic field variation and alternately creating, in the magnetocaloric element (4), a heating cycle and a cooling cycle, generating creation of and maintaining a temperature gradient between two opposite ends (7, 8) of the magnetocaloric element (4), and alternating displacement of the heat transfer fluid being synchronized with the magnetic field variation;
- the thermal flux generation unit (2, 102, 202) comprising a field closing device (30, 31, 32) arranged to loop magnetic flux generated by the magnetic arrangement (9, 24);
- the magnetocaloric element (4) being integrated in a closed heat transfer fluid circulation circuit (6) which interconnects the two opposite ends (7, 8) of the magnetocaloric element (4) with one another,
- the closed heat transfer fluid circulation circuit (6) comprising a single means of displacement (5, 50, 60) of the heat transfer fluid through the magnetocaloric element (4) in both displacement directions; and
- the field closing device (30, 31, 32) comprising a control device (19, 192) for driving the means for displacement (5, 50, 60) of the heat transfer fluid;
- wherein the thermal flux generation unit has a linear structure in which the magnetocaloric elements are aligned, and the magnetic arrangement is driven in reciprocating translation along the magnetocaloric elements, the field closing device has a yoke-shaped profile with legs which are provided, on internal faces thereof, with permanent magnets with opposite polarities and make up the magnetic arrangement, the control device comprises two permanent magnets with different polarities located opposite and spaced from one another, and the means of displacement is a piston which comprises a magnet arranged with respect to the permanent magnets of the control device such that the piston is pushed back by each of the permanent magnets of the control device.

14. A heat generator with magnetocaloric material comprising:
- at least one thermal flux generation unit (2, 102, 202) comprising at least one thermal module (3) having a magnetocaloric element (4) with two opposite ends (7, 8),
- a heat transfer fluid being alternately displacable across the magnetocaloric element (4) between the two opposite ends (7, 8);
- a magnetic arrangement (9, 24) generating a magnetic field being located adjacent to and movable with respect to the magnetocaloric element (4), the magnetic field acting upon the magnetocaloric element (4), alternating movement of the magnetic arrangement (9, 24) with respect to the magnetocaloric element (4) alternately creates a heating cycle and a cooling cycle in the magnetocaloric element (4) such that a temperature gradient, between the two opposite ends (7 and 8) of the magnetocaloric element (4), is generated and maintained, the alternating displacement of the heat transfer fluid being synchronized with the alternating movement of the magnetic arrangement (9, 24) with respect to the magnetocaloric element (4),
- the least one thermal flux generation unit (2, 102, 202) comprising a field closing device (30, 31, 32) being arranged to loop the magnetic field generated by the magnetic arrangement (9, 24), and the field closing device (30, 31, 32) comprises a control device (19, 192);
- the magnetocaloric element (4) being integrated in a closed heat transfer fluid circulation circuit (6) connecting the two opposite ends (7, 8) of the magnetocaloric element (4) with one another, and
- the closed heat transfer fluid circulation circuit (6) comprising a single displacement device (5, 50, 60) for alternately displacing the heat transfer fluid across the magnetocaloric element (4), in opposite displacement directions, and the control device (19, 192) controlling the displacement device (5, 50, 60).

* * * * *